(12) United States Patent
Sato

(10) Patent No.: US 6,486,077 B2
(45) Date of Patent: Nov. 26, 2002

(54) SILICON NITRIDE FILM, SEMICONDUCTOR DEVICE, AND METHOD FOR FABRICATING SEMICONDUCTOR DEVICE

(75) Inventor: Hidekazu Sato, Kuwana (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/942,949

(22) Filed: Aug. 31, 2001

(65) Prior Publication Data

US 2002/0041031 A1 Apr. 11, 2002

(30) Foreign Application Priority Data

Sep. 1, 2000 (JP) .................................... 2000-266266

(51) Int. Cl.[7] .............................................. H01L 21/31
(52) U.S. Cl. ......................................... 438/763; 257/798
(58) Field of Search .................................. 438/763, 761, 438/778, 791–794, 624, 724; 257/798, 63, 655–657, 55, 646; 264/626; 501/97.1

(56) References Cited

U.S. PATENT DOCUMENTS 5,114,693 A * 5/1992 Hintermayer et al. ........ 423/344

FOREIGN PATENT DOCUMENTS

JP 63-40314 2/1988

* cited by examiner

*Primary Examiner*—Craig Thompson
(74) *Attorney, Agent, or Firm*—Armstrong, Westerman & Hattori, LLP

(57) ABSTRACT

The present invention is to form a new desirable silicon nitride film of lower dielectric constant even by using common gases. More preferably, it should be well compatible with copper wiring if it is applied as an interlayer insulating film. A silicon nitride film comprising a ratio of N:Si of from 1.0–1.1: and a ratio of O:Si of from 0.1–0.15:1, and being formed through catalytic CVD method by using monosilane and ammonia, and thereby having a relative dielectric constant of less than 6. Also, a semiconductor device is provided employing the above silicon nitride film as an interlayer insulating film, favorably, between copper layers.

10 Claims, 7 Drawing Sheets

3 SAMPLE
6 CATALYZER (TUNGSTEN)

SILICON NITRIDE FILM, SEMICONDUCTOR DEVICE, AND METHOD FOR FABRICATING SEMICONDUCTOR DEVICE

CROSS-REFERENCE TO RELATED APPLICATION

This application is based upon and claims priority of Japanese Patent Application No. 2000-266266, filed on Sep. 1, 2000, the contents being incorporated herein by reference.

BACKGROUND OF THE INVENTION

1. Field of the Invention

This invention relates to formation of a low temperature silicon nitride film, which can be applied for the interlayer insulation film of LSI, for instance.

Since the stray capacitance between two wirings being apart from each other increases if the dielectric constant of the insulating layer is high, it becomes an obstacle in high-speed operation of the device when plural wirings are structured in a multi layer, placing the insulation layer between the wiring layers, stacking one by one, and thereby forming a semiconductor device. Nowadays, it becomes remarkable that the stray capacitance between wirings can be lowered by lowering the dielectric constant of the insulation film material between such layers as much as possible because the insulation film between layers cannot be so thickened along with making of the entire semiconductor device smaller and more integrated, and thereby, trying to obtain higher operating speed performance of the device. At the same time, because recent highly integrated semiconductor devices are desired to be processed in a much lower temperature compared with the conventional process, a lower temperature formation of the interlayer insulating film has been highly demanded recently.

2. Discussion of the Related Art

In accordance with recent developments of higher integration of Large Scale Integration Circuit (LSI), even a semiconductor device element of less than 0.2 μm minute size is now integrated in the Si substrate surface. LSI can obtain its function by connecting between the semiconductor device elements through wirings. However, if wirings are arranged to make a detour in order to avoid forming unwanted cross-sections with other wirings, then wirings will occupy a large part of the chip surface, and moreover, such long wirings will raise unwanted signal delays. Then, it has been commonly applied that wirings are arranged in a multilayer structure so as to connect with each other up and down through an interlayer insulating film between them. FIG. 1 illustrates a cross-sectional view of a multilayer wiring structure.

Insulation film 1631 is formed on a silicon substrate 161, and the contacting plug is formed inside an opening through the insulation film 1631 so that a first wiring 1651 is electrically connected with device formation region 162. In addition, a second connection is formed between the first wiring 1651 and a second wiring 1652 through a via plug, which is buried in a via hole 1661 opening in an insulation film 1632, and a third connection is formed between the second wiring 1652 and a third wiring 1653 through a via plug, which is buried in a via hole 1662 opening in an insulation film 1633. In accordance with the same manner as aforementioned repeatedly in several times, a multilayer wiring structure will be accomplished, and such multilayer formation process will be finalized by covering the uppermost wiring by depositing sealing film 167.

However, because the multilayer wiring structure is comprised of thin insulation films between wirings, stray capacitance will significantly appear, and it will therefore cause the wiring delay. Also, crosstalk can be caused when each of two high frequency signals flows through each of two wirings isolated by the interlayer insulating film with each other respectively, and thereby misoperation will frequently occur. Such crosstalk problems or signal delays will be prevented if only the interlayer insulating film is formed thick enough to keep a distance between wirings. However, on the other hand, if the interlayer insulating film is thickly formed then it is necessary to deeply open a contact hole or via hole. The formation of a deep contact hole or a deep via hole through such a thick interlayer insulating film should make an opening step more difficult. From the above point of view, the interlayer insulating film should be thinner rather than thicker. For the new generation device later than 256 Mbit DRAM (Dynamic Random Access Memory), a contact hole diameter will be smaller than 0.25 μm than before along with the development of higher integration. However, for making the opening by dry etching easy, an aspect ratio, namely a ratio between contact hole depth and contact hole diameter, should be no more than 5. If the contact hole diameter should be less than 0.25 μm and the aspect ratio should be less than 5, then the thickness of the interlayer insulating film is to be as thin as less than 1 μm.

Meanwhile, as likely as the aforementioned problem between upper and lower wiring layers, the stray capacitance problem might be seriously occurred even between two wirings adjacent to each other disposed on the same interlayer insulating film. This is because, according to miniaturization of the semiconductor device, the distance between wirings as well as the width of such wirings will be shortened. In the near future, inevitably the width of the wiring could be less than 0.25 μm. It is highly demanded that the wiring intervals should not be expanded because of such miniaturized semiconductor device's super-high integration.

To solve the problem between upper and lower wirings, there is room for doing the effort to thicken the insulation film between interlayer insulating films as much as possible. However, as the function of the circuit is complicated, there becomes no room for designing around, and thus the problem between plural wirings on the same interlayer insulating film will be more serious than the problem between upper and lower wirings.

When the circuit is designed, distribution constant circuit handling is necessary either in the case of the same level wirings or in the case of upper and lower wirings to accurately understand the wiring delay according to the increase of the capacitance between the wirings decided by interlayer insulating film thickness and crosstalk.

FIG. 2 shows the capacitance for each unit wiring length between the wiring layer and the silicon substrate being insulated by silicon oxide film of H in thickness (relative dielectric constant 3.9) from which R. L. M. Dang are shown on volume EDL-2 and page 196 of IEEE Electron Device Letters in 1981. It is shown as the width W of wiring decreases that actual capacitance C greatly increases by a so-called fringe effect compared with the capacitance calculated by the parallel plate electrode approximation. Moreover, when height T of wiring is large at the same time, it is understood that capacitance C increases more and more.

Moreover, according to FIG. 3, which is shown in the above reference, total capacitance Cf per unit length between wiring and silicon substrate should be increased along with miniaturization of its wiring intervals only if wiring width W/wiring thickness H exceeds one, because the capacitance C12 between two wirings isolating so as to have wiring interval S is increased nevertheless capacitance C11 between wiring and silicon substrate is decreased. That is, each of the device elements could be highly operatable if the device is highly integrated and miniaturized, however, the wiring resistance and stray capacity generally increase if each of inter-element wirings is also highly integrated and miniaturized. As a result, operation speed as the entire LSI will not rise at all.

The result of FIGS. 2 and 3 is an analytical result concerning the stray capacitance between wiring and the silicon substrate, which are isolated from each other by an interlayer insulating film. Strictly to say, this is not the same result as the stray capacitance between upper and lower wirings. However, circumstances are substantially the same for the stray capacitance between the wiring layers. For instance, Japanese Laid-Open Patent Specification Hei 10-223625 discloses such a problem. Now, the development of new material, which is well applicable to interlayer insulating film even in highly integrated semiconductor devices, is highly demanded as a substitute for conventional silicon nitride film of the relative dielectric constant 7 or silicon oxide film of the relative dielectric constant 3.9, under the aforementioned technical background.

Especially, the silicon nitride film is broadly applied to insulation film between layers as a diffusion barrier layer or an etching stop layer or between wiring materials. Thus, M.Tanaka et al. disclosed a new approach to develop an insulating material of smaller relative dielectric constant at International Symposium on VLSI Technology 1999. Such new insulating material disclosed at that Symposium is amorphous silicon nitride chloride film (SiNCl), in which the dielectric constant can be decreased to even less than 5.4.

Although the aforementioned SiNCl (amorphous silicon nitride chloride) film seems to be effective in such low dielectric constant at present, the relative dielectric constant should greatly still decrease further compared with conventional silicon oxide or other well-known insulating materials. Also, SiNCl film formation needs rare gas as a raw material, and therefore film formation cost could be raised compared with conventional film formation to which common $SiH_4$ is applied. In addition, $Si_2Cl_6$ liquefies easily and there are difficult handling problems among use of $Si_2Cl_6$ and $NH_3$ as a raw material gas at SiNCl film formation.

Moreover, the adoption of copper (Cu) or copper (Cu) alloy wiring material might become a major trend replacing the aluminum wiring material in the future as a more miniaturized semiconductor device besides the above-mentioned problem. This is because in order to lower the wiring resistance which has become noticeable as the wiring layer becomes finer, it has become necessary to use wiring material with lower resistance. Copper (Cu) is comparatively difficult to handle in the process of the semiconductor device, and when it is adopted, it requires new solutions of problems. One of the problems is known that if copper is simply placed directly contacting an interlayer insulating film such as a silicon oxide film, the copper diffuses into the interlayer insulating film due to the heat during the process. In order to solve this problem, it is necessary to form a diffusion barrier so that the wiring layer and silicon oxide film are separated and do not contact each other. Therefore, it is desirable that the insulation film has a high barrier performance against copper diffusion for a very-highly-integrated future device, which inevitably will adopt copper (Cu) or copper alloy wiring material.

SUMMARY OF THE INVENTION

This invention provides a solution for the aforementioned problems of the prior art and is to develop a new desirable silicon nitride film formation technology, which is suitable for a very-large-scale-integrated semiconductor device. More specifically, the silicon nitride film with lower relative dielectric constant suitable for interlayer insulating film can be obtained from $SiH_4$ and $NH_3$ without using a special gas. Especially, in a miniaturized semiconductor device where wiring material contains copper, the diffusion control ability of copper is improved as a secondary effect, and thus it is generally applicable to the fabrication process for a highly miniaturized semiconductor device. In general, the problem to be solved by the present invention is to establish a desirable silicon nitride film formation technology of the very-large-scale integrated semiconductor device.

As a solution against such related art's problem, each of the following inventions, for instance, can be applied according to the present invention.

(1) A first aspect is a silicon nitride film comprising a ratio of N: Si of from 1.0–1.1:1 and a ratio of O: Si of from 0.1–0.15:1, and being formed through catalytic CVD method using monosilane and ammonia, and having a relative dielectric constant of 6 or less. Here, the catalytic CVD method can be carried out using at least one catalyst selected from the group consisting of tungsten, platinum, palladium, molybdenum, silicon, alumina, silicon carbide, a metallic-deposited ceramics, tantalum, titanium, titanium oxide, and vanadium. A heating resistance can be applied to the catalyst.

According to the first aspect, a silicon nitride film with a low dielectric constant of 6 or less is obtained easily and at low cost by using common gases of $SiH_4$ and $NH_3$.

(2) A second aspect is a semiconductor device having the silicon nitride film of (1) at least in part of the insulating layer.

(3) A third aspect is a semiconductor device having the silicon nitride film of above (1) at least in part of the interlayer insulating layer in the multilayer structure.

(4) A fourth aspect is a semiconductor device comprising an interlayer insulating layer of said silicon nitride film as in each of the above between copper-including layers.

(5) A fifth aspect is a semiconductor device having: a silicon nitride film described in above (1) covering a lower wiring layer; and a planarized insulating layer of one member selected from the group consisting of silicon oxide, silicon oxynitride, FSG (fluorosilicate glass), BPSG (boro phosphosilicate glass), PSG (phosphosilicate glass), and USG (undoped silicate glass) covering the silicon nitride film.

(6) A sixth aspect is a method for fabricating a semiconductor device, comprising the steps of: forming an interlayer insulating layer of silicon nitride film of above (1); depositing a film selected from at least one material selected from the group consisting of silicon oxide, silicon oxynitride, FSG (fluoro silicate glass), BPSG (borophosphosilicate glass), PSG (phosphosilicate glass), and USG (undoped silicate glass); and forming a planarized insulating film by polishing the surface of said film.

In the method for fabricating a semiconductor device as in the above, the interlayer insulating film formation step through the catalytic CVD method can be performed by controlling a substrate holder temperature over 150° C.

As to advantageous effects of the present invention, there is an effect that silicon nitride film, which is broadly applicable to the miniaturized or large-scale integrated semiconductor devices, can be easily formed by using commonly used gases according to the present invention. More specifically, the silicon nitride film is desirable for the use in the miniaturized or super large-scale integrated semiconductor device in the following two viewpoints.

First, a new silicon nitride film of lower dielectric constant can be formed from common gas under low temperature. Therefore, the new silicon nitride film of the present invention is applicable to an interlayer insulating film between wirings inside the miniaturized semiconductor device. That is, the present invention is favorably applicable to the fabricating process for forming the miniaturized or very large-scale integrated semiconductor devices. In the related art, the high dielectric constant of the interlayer insulating film has prevented the device from high-speed operation. Further, long time heating process badly influences the other device formation areas on the same substrate during the formation step of the interlayer insulating film if not through low temperature formation process, and thereby, the device characteristic would be degraded. Otherwise, yield ratio in final product quality would be critically worsened. However, the present invention will solve at once all of the above. Moreover, because very common gas can be used, the advantage on the manufacturing cost side can be acquired.

In addition, according to the present invention, the effect of preventing copper (Cu) diffusion is much better than common silicon nitride, and thus it is favorably combined with a copper (Cu) containing wiring layer. Each of wiring layers are becoming to be very fine in the highly miniaturized recent device, and thereby wiring layer resistance would become a significant problem even by using aluminum-alloy. In such a situation, conventional wiring material, i.e., aluminum or aluminum alloy must be replaced by copper (Cu) or copper (Cu) alloy for the next generation devices. The new silicon nitride film (SiN) of the present invention is particularly favorable for the miniaturized or super highly integrated devices employing such copper containing wirings.

DETAILED DESCRIPTION OF PREFERRED EMBODIMENTS

Reference is now made in detail to specific embodiments of the present invention that illustrate the best mode presently contemplated by the inventors for practicing the invention.

Figure 1:
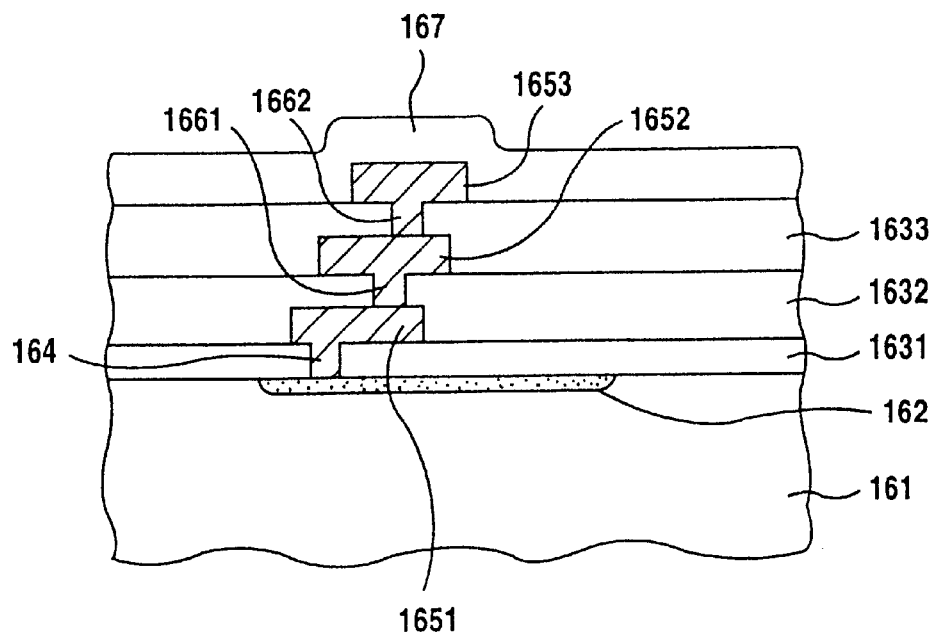
FIG. 1 is a cross-sectional view of the multi-layer wiring structure according to the related art.
Figure 2:
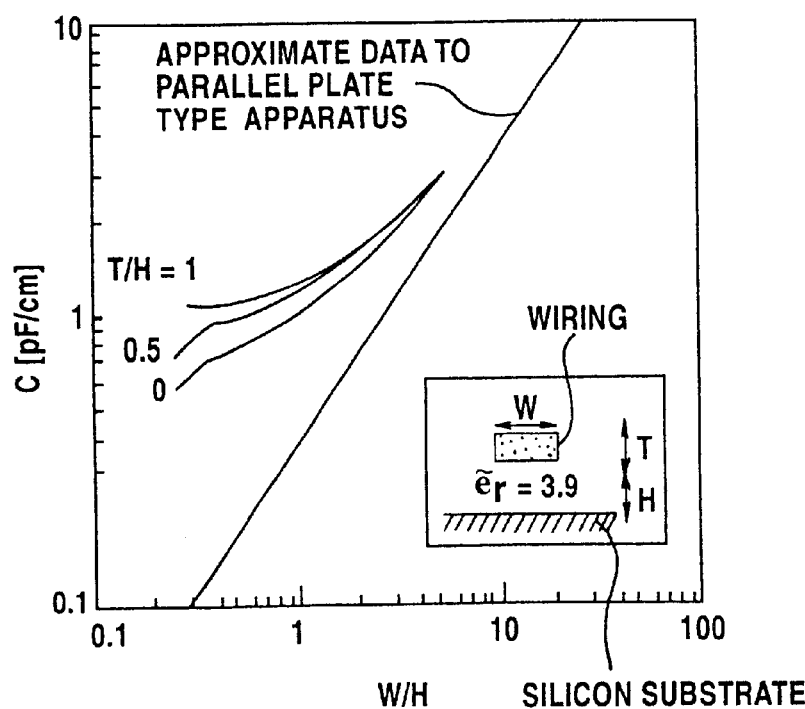
FIG. 2 is an explanatory figure (No. 1) of the stray capacitance analysis result between the wiring layers.
Figure 3:
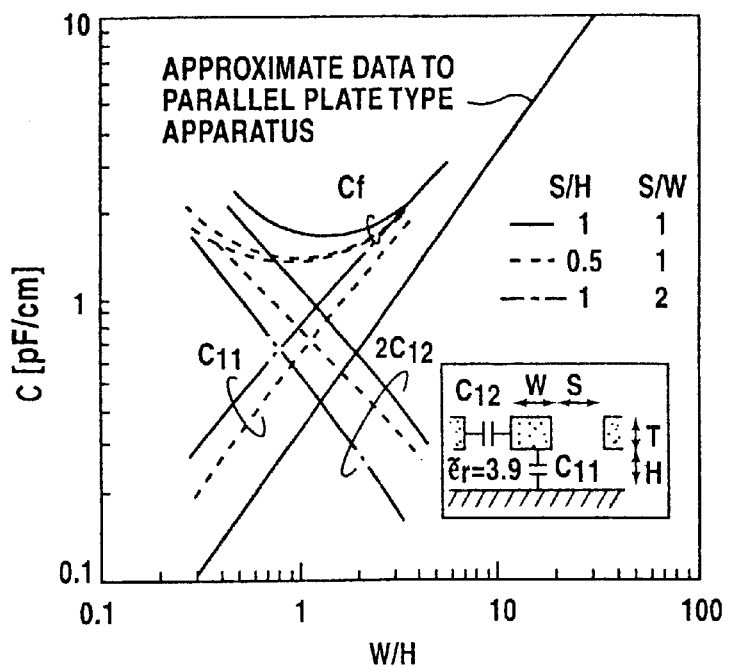
FIG. 3 is an explanatory figure (No. 2) of the stray capacitance analysis result between the wiring layers.
Figure 4:
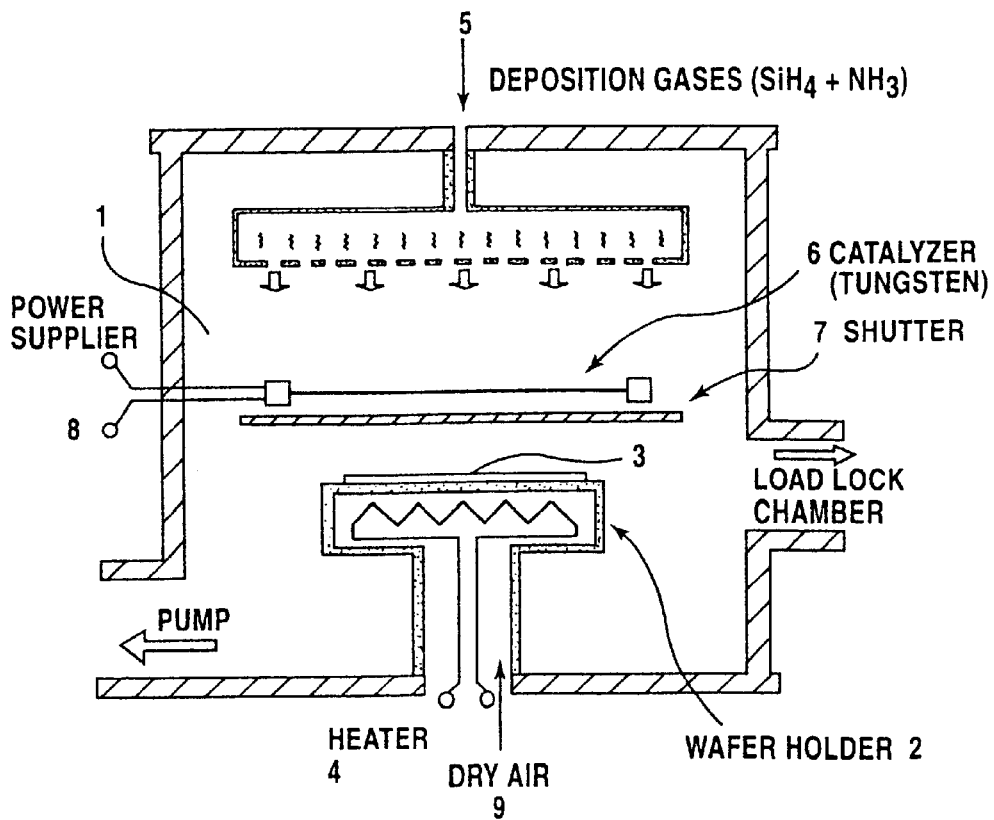
FIG. 4 is a cross-sectional view of a catalyst CVD apparatus according to the embodiment of the present invention.
Figure 5:
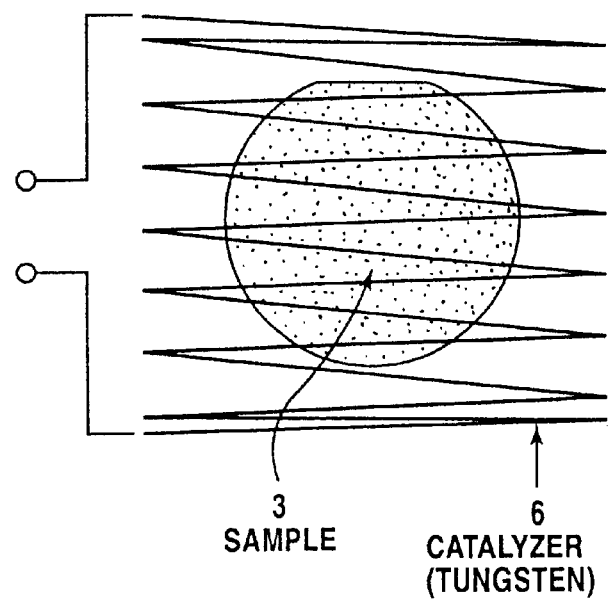
FIG. 5 is an upper view of catalyst CVD apparatus chamber according to the embodiment of the present invention.

A favorable embodiment of the present invention will be exemplified. First of all, it explains a catalyst CVD device used in the first embodiment of the present invention referring to FIG. 4 before the manufacturing process of an actual device is outlined. FIG. 4 illustrates a structural feature of the catalyst CVD device used in the first embodiment. A turbo molecular pump (not shown in the figure) is connected with vacuum container 1 which becomes a reactive room through a valve (not shown in the figure), and the intermediate products or the unreacted gas is exhausted by this pump. Moreover, heater 4 is installed for sample 3 to be put on substrate holder 2 at the center of the lower side of the vacuum container and to heat the sample to the substrate holder, and the temperature of the substrate holder is observed with a thermo-couple (not shown in the figure). Moreover, gas inlet 5, which has a showerhead to spout $SiH_4$ and $NH_3$ as a raw material gas, and tungsten catalyst body 6 are arranged opposing the sample. Shutter 7 is installed between the two, and, thereby start/end points of the film formation steps are controlled. Thereby, exchange electric power of approximately 700W, e.g., 680W, is supplied from an exchange power supply 8 to the tungsten catalyst body, and thereby the tungsten catalyst body is heated up to the temperature of 1600-1900° C. Also, the substrate holder is sometimes heated by radiant heat from the tungsten catalyst body when the tungsten catalyst body is heated. However, in the case that the substrate holder's temperature is increased by the radiant heat is too significant to be disregarded, dry air 9 is supplied from the bottom side of the substrate holder in order to cool down the substrate holder, and to adjust it to an appropriate temperature. Incidentally, the temperature of the resistance heater of the tungsten catalyst body can be estimated by dependency of electroresistivity of the tungsten catalyst body upon the temperature. But as another approach, it can be estimated also by electrical infrared radiation thermometer through a quartz window installed in the vacuum chamber. In this connection, the installation situation of the tungsten catalyst body as seen from the upper surface of the vacuum chamber is illustrated in FIG. 5. The inventors of the present invention tried to form a silicon nitride film on the wafer 3 by the situation that $SiH_4$ (0.5 sccm) and $NH_3$ (100 sccm) were supplied from gas inlet 5, and the gases are sprayed to the catalyst body 6, which is highly heated up through resistance heating, in order to perform contacting decomposition. In this case, the temperature of substrate holder 2 has been changed. The pressure during film formation was set at 2.5 mTorr.

Figure 6:
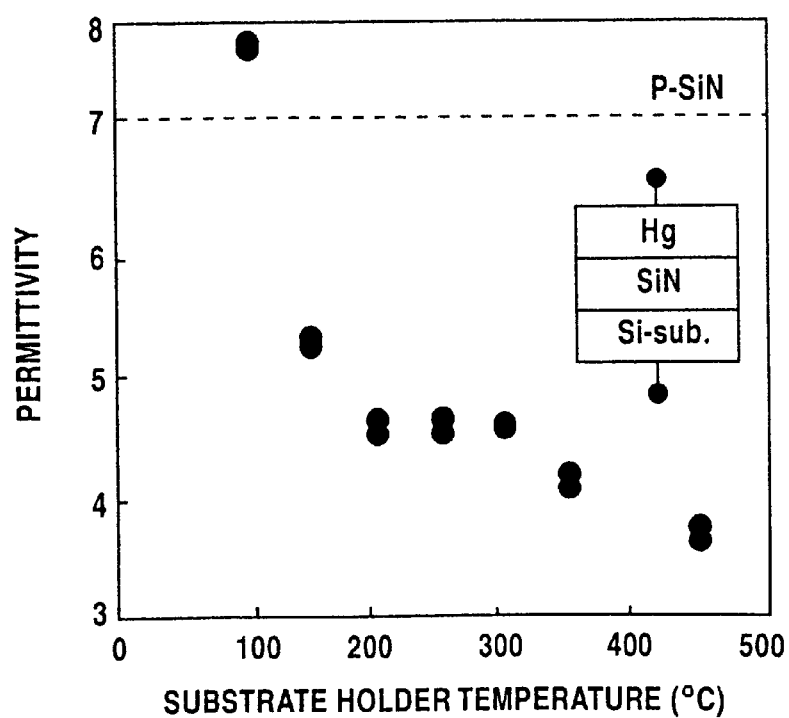
FIG. 6 is an explanatory figure illustrating the correlation of the relative dielectric constant and the temperature of the substrate holder.
Figure 7:
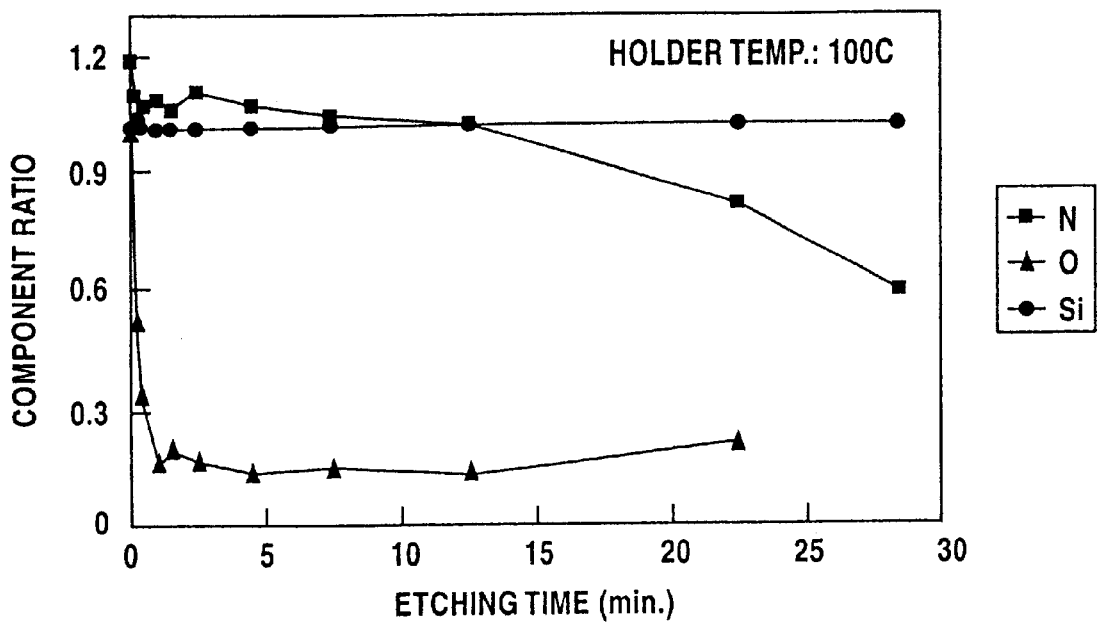
FIG. 7 is an explanatory figure illustrating the relation to the composition ratio in the direction of depth of the temperature of the substrate holder and the silicon nitride film (in case of 100° C. temperature of the substrate holder).
Figure 8:
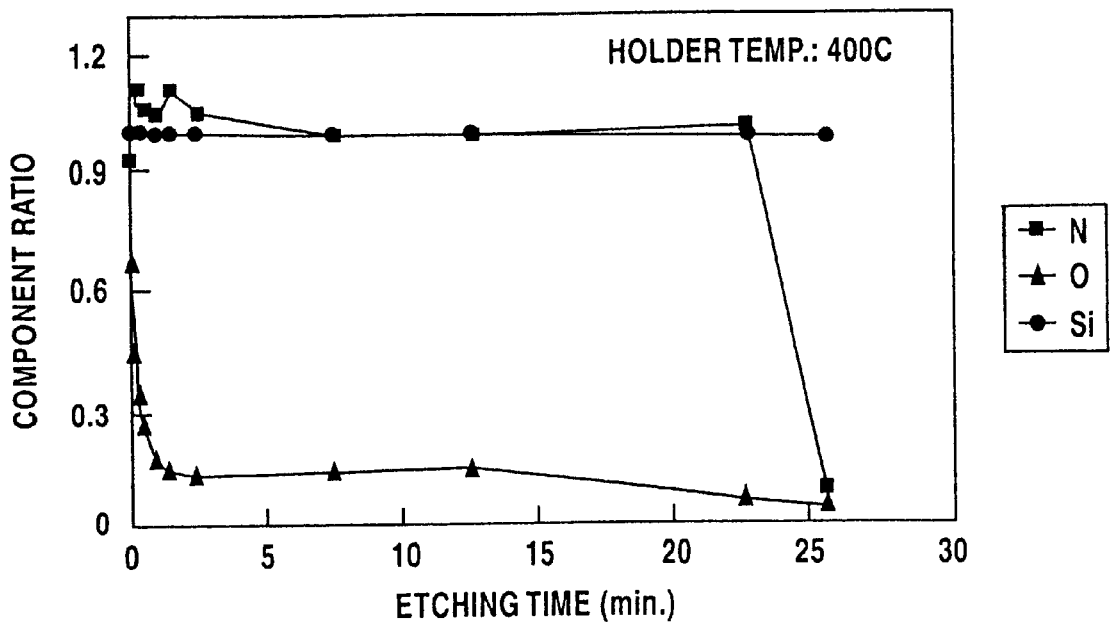
FIG. 8 is an explanatory figure illustrating the relation to the composition ratio in the direction of depth of the temperature of the substrate holder and the silicon nitride film (in case of 400° C. temperature of the substrate holder).

Thus, the relative dielectric constant was calculated from the relation between C-V characteristics and optical film thickness, which is measured by ellipsometry. Mercury was used for the electrode measuring the C–V characteristic. FIG. 6 shows the correlation of the relative dielectric constant and the temperature of the substrate holder. It is understood from FIG. 6 that it is decreased to 5.3 by increasing the temperature of the substrate holder from 100° C. to 150° C. and also it is decreased to 4.6 or lower value by increasing the temperature up to 200° C. FIGS. 7 and 8 show the result of the analysis of the composition ratio in the direction of depth of the silicon nitride film where film formation was done when setting it to the temperature of the substrate holder, 100° C. and 400° C. by using X-ray photoelectric spectrum (XPS) method. In the sample of 100° C. in temperature of the substrate holder, the change is seen, and the existence of the transition area of the composition ratio is confirmed to the composition ratio in the vicinity of the interface of the silicon nitride film and the silicon substrate. However, the area where the composition ratio changes is not confirmed in the sample of 400° C. Moreover, it is understood that there is a similarity in the composition ratio between the upper layer in the composition transition area of the silicon nitride film, in which the temperature of the substrate holder is set to 100° C., and the silicon nitride film at 400° C. of the substrate holder temperature.

Figure 9:
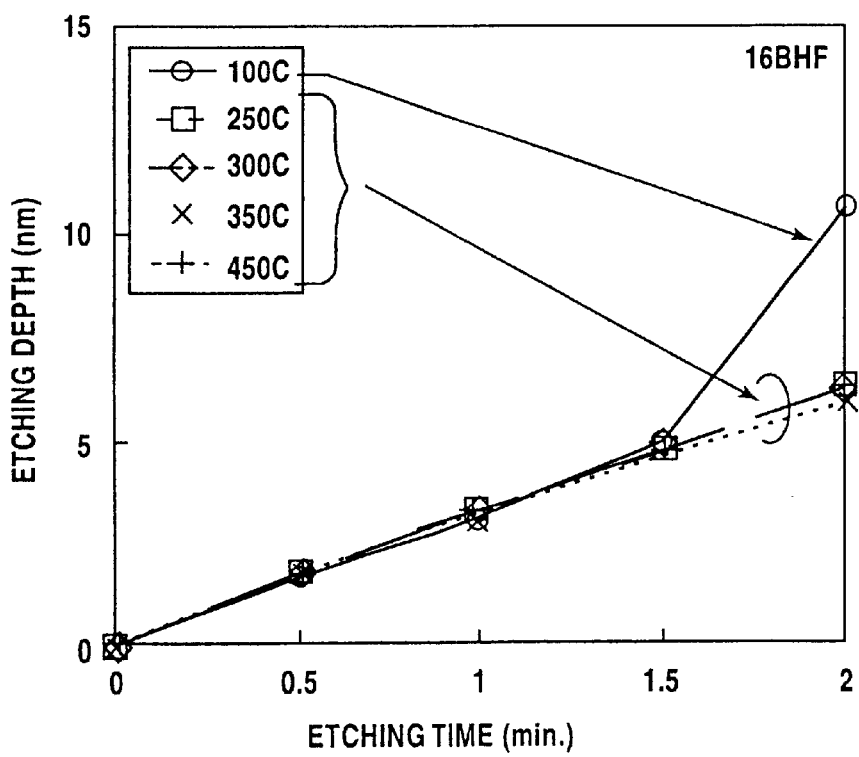
FIG. 9 is an explanatory figure illustrating the etching rate which uses the buffered hydrofluoride acid solution which is called 16BHF.

Moreover, the result of observing the etching rate by using the buffered hydrofluoride acid solution, which is called 16BHF, is shown in FIG. 9, in case that the temperature of the substrate holder is altered in the same manner as above and that silicon nitride of approximately 20 nm thickness is formed on the silicon substrate. In FIG. 9, data is shown only up until 2 minutes in etching time. However, we can understand from FIG. 9 that the change is seen in the etching rate for 1.5-2 minutes etching time only with the sample of 100° C. in temperature of the substrate holder, and the existence of the transition area of the composition ratio is suggested from this data.

Figure 10:
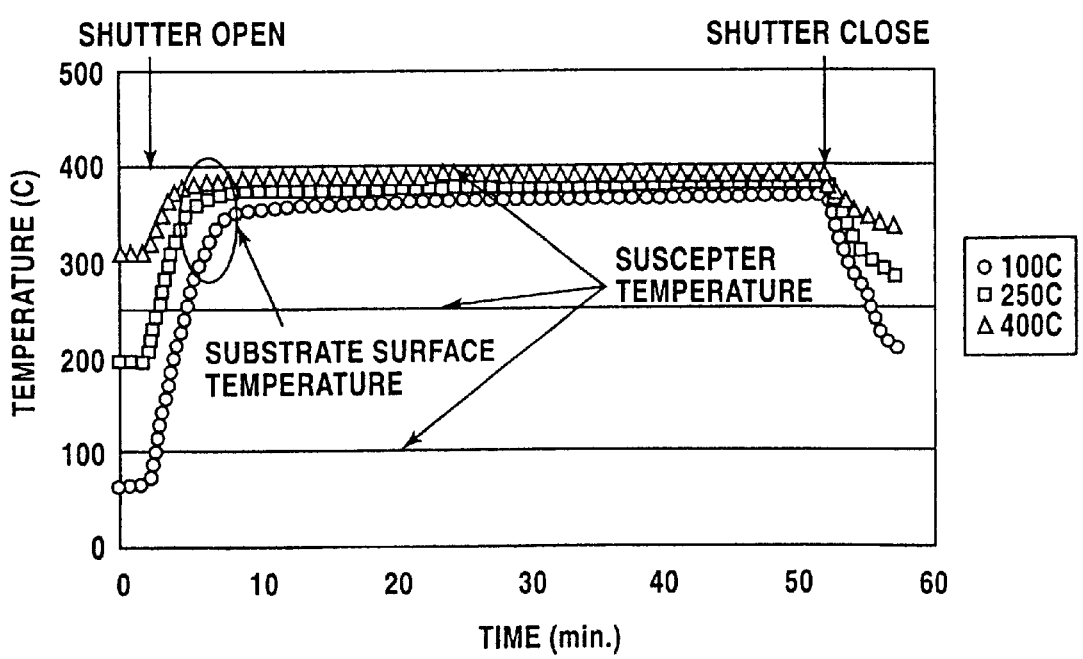
FIG. 10 is an explanatory figure (No. 1) illustrating the result of investigating the temperature change in the surface of the silicon substrate by the difference of setting the temperature of the substrate holder.
Figure 11:
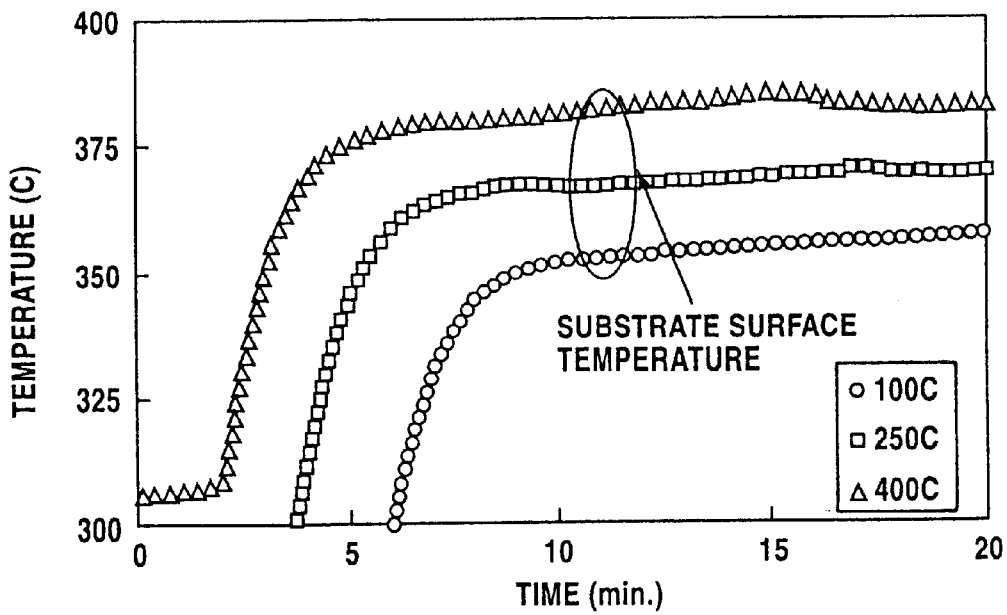
FIG. 11 is an explanatory figure (No. 2) illustrating the result of investigating the temperature change in the surface of the silicon substrate by the difference of setting the temperature of the substrate holder.

FIGS. 10 and 11 show the result of investigating the temperature change in the surface of the silicon substrate by the difference of setting the temperature of the substrate holder. The difference of the attainment temperature of the substrate surface temperature is within 30° C., and it is not believed that this is not a rule factor to control the composition ratio. There is a large difference between the necessary time for the substrate surface temperature being almost saturated. Also, the necessary time to the saturation becomes longer in case that the substrate holder is set to be a lower temperature. Further, it seems that the silicon nitride film formed in the area of altering the substrate surface temperature corresponds to the transition area of the composition ratio.

Figure 12:
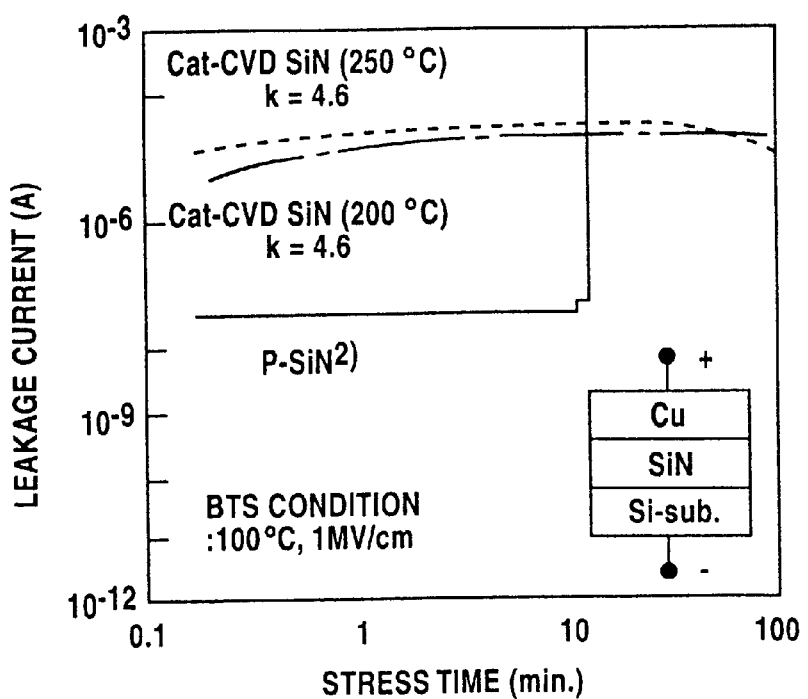
FIG. 12 is an explanatory figure illustrating the result of the Bias and Temperature (BT) stress test.

Also, the result of Bias and Temperature (BT) stressing test is shown in FIG. 12. The figure shows also the data resulting from PECVD-formed silicon nitride film as a comparison data, which is excerpted from a report by M. Tanaka et al. at the 1999 International Symposium on VLSI Technology. As shown in FIG. 12, silicon nitride of the present invention has much longer life time from the viewpoint of BT stressing test than ordinary PECVD-formed silicon nitride film (shown as 'P-SiN' in the figure), and it is also more excellent than an ordinary silicon nitride film from the viewpoint of the diffusion control ability of copper (Cu). This means that silicon nitride of the present invention reaches a level which can be favorably used for the copper (Cu) wiring process.

Then, it explains the manufacturing process when the silicon nitride film of this invention is applied as the insulation film of an actual semiconductor device between layers.

Figure 13:
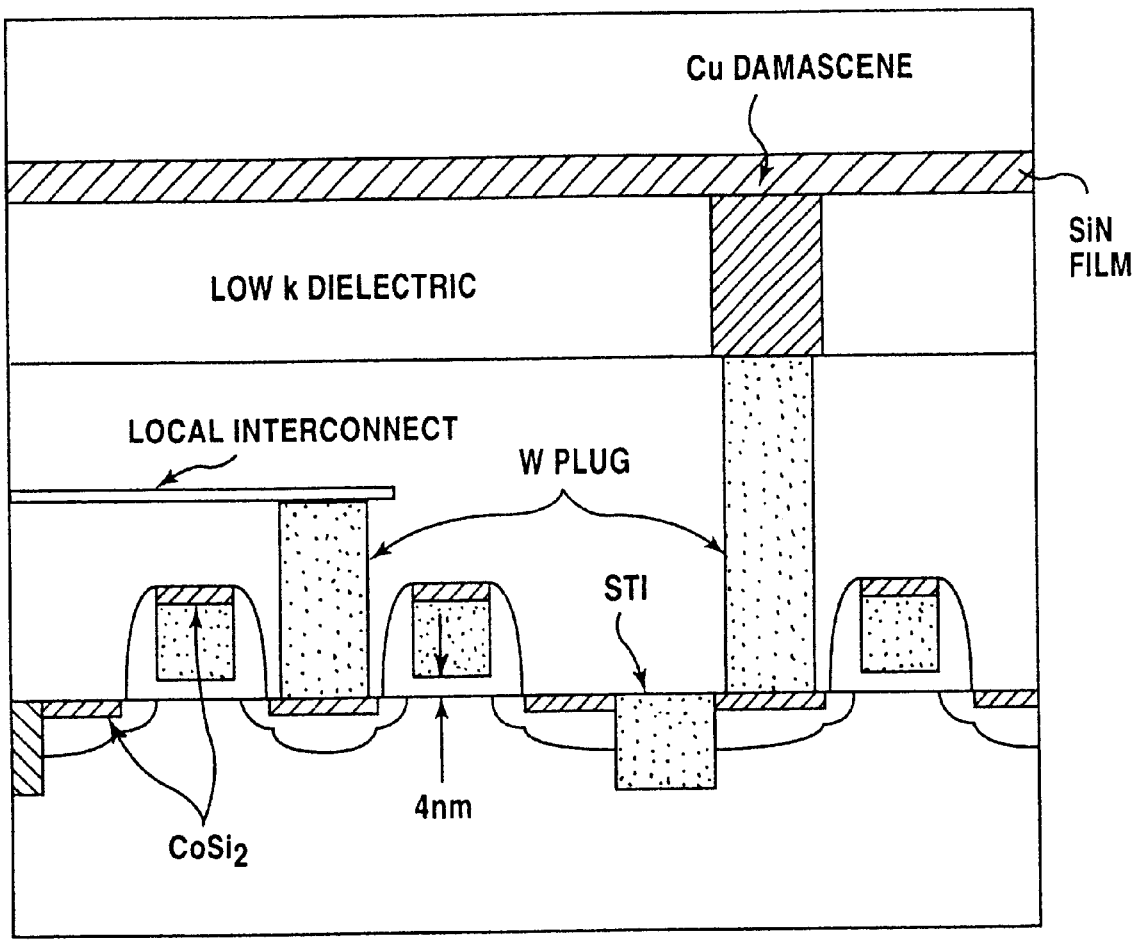
FIG. 13 is a cross-sectional view of the semiconductor device according to one embodiment of the present invention.

FIG. 13 is a partial cross section of the semiconductor device of the first embodiment of the present invention. A shallow trench isolation is formed on the surface of the silicon substrate by a known method. The silicon oxidation film is thinly formed on the silicon substrate, a conductive amorphous silicon layer is formed through CVD (chemical vapor deposition) method evenly introducing impurity. Next, the amorphous silicon layer is patterned using a known photolithography technique and made into a gate electrode. Next, a silicon oxide film covering the gate electrode is deposited using the CVD method at a thickness sufficient to cover the whole surface of the substrate. The silicon oxide film is removed by etching back using RIE (Reactive Ion Etching) to leave the side wall of the oxidation film on the side of the gate electrode. Here, the silicon oxide film is removed from the top of the gate electrode, and the top of the gate electrode is exposed. Up to this stage, conductive impurity is introduced by the ion implantation in the silicon substrate forming source and drain regions. Then a cobalt film is formed on the whole surface of the structure after the above-mentioned process including the top of the gate electrode and the exposed silicon substrate surface. Next, the cobalt film and silicon of the top of the gate electrode or the silicon substrate surface are heated to react forming silicide. Here, the cobalt film does not react where it contacts other than silicon, thus, cobalt silicide (CoSi) is formed on the top of the gate electrode and the silicon substrate surface in a self-aligning manner. After the silicidation of the cobalt film, cobalt (Co) is selectively removed by using the etching rate difference between cobalt (Co) and cobalt silicide (CoSi) leaving only the cobalt silicide (CoSi). The above process of making the silicide in a self-aligning manner is well-known as salicide (abbreviation of self-aligned silicide) in the industry. As described above, a plurality of transistors are formed having a gate electrode with an oxide film side wall on the side on the silicon substrate surface.

Next, a thick interlayer insulation film is formed completely covering the structure resulting from the above-mentioned process. For instance, BPSG (borophosphosilicate glass) is deposited so as to entirely cover the gate electrode at a thickness enough to mitigate roughness of the gate electrode. Here, instead of the BPSG film, various films, such as USG (un doped silicate glass, which does not contain electroconductive impurity) film, PSG (phosphosilicate glass) film, and BSG (borosilicate glass) film, can be used for the same purpose. The BPSG film, the BSG film, and the PSG film are preferable for heating reflow to smooth the surface after the formation of CVD film. This is because the heating reflow can be done at a comparatively low temperature, and the BPSG film is the most desirable in this viewpoint. However, even the reflow is performed at a fairly low temperature, the heat cannot be ignored in recent highly integrated devices as a cause of undesired property changes such as unnecessary impurity diffusion. Therefore, instead of the heating reflow, a recent mainstream technique planarizes the top of the interlayer insulating film formed by CVD using CMP (Chemical Mechanical Polishing) method. Since the CMP method does not require heating, the heating process can be reduced.

Also, electroconductive impurity, which was purposely introduced in the insulation film material to enable the low temperature reflow, at the same time can be removed. This is desirable to match the etching rate with other insulation films, and also desirable for solving problems caused by the impurity diffusion in the place where insulation film contacts wiring metal. It is desirable to form an interlayer insulating film of USG adopting the CMP method in the manufacture of highly integrated semiconductor devices. Moreover, if the HDP film (high-density plasma CVD oxidation film) is used in the process, the film is closely formed.

Next, resist is coated so as to entirely cover the planarized surface of the interlayer insulation film. This resist is exposed to a mask pattern using a known photolithography technique, tanscribing the pattern, and a resist mask with openings is obtained after development. By RE (reactive ion etching) using this resist mask, windows corresponding to the source and drain regions on the silicon substrate side are formed. Tungsten (W) is deposited by CVD (chemical vapor deposition) at a thickness enough to bury in the formed window. Tungsten (W) is etched back using the CMP (chemical mechanical polishing) method to form a tungsten plug. Next, a conductive layer is formed by patterning to electrically connect and form a local interconnection with the head of the tungsten plug. Thereafter, the resultant structure including the local interconnection is thickly covered by an interlayer insulating layer. Here, it is desirable to use HDP film (high density plasma CVD oxidation film). In addition to the aforementioned reasons, if the HDP film is applied for the upper interlayer insulating film as well as for lower interlayer insulating film, then there is no difference in etching rate between upper and lower interlayer insulating layers when a deep opening is opened using RIE (reactive ion etching), and eliminating the need for a special etchant recipe taking the etching rate difference into consideration. The top of the thus-formed thick interlayer insulating film is planarized using CMP (chemical mechanical polishing), and the tungsten plug is formed in this deep window according to a process similar to the aforementioned.

Moreover, a low dielectric constant material is newly deposited as the interlayer insulating film. For instance, a material which is called "Low-k" is coated by using a spin coater and is then baked to form an interlayer insulating layer. Then, windows are opened through the Low-k interlayer insulating film by a known photolithography method so as to connect with the tungsten plug, which is previously formed in the above step. In other words, resist is coated on the surface of Low-k interlayer insulating layer by a spin coater and after solidifying, the resist is exposed to a mask pattern transcribing the pattern. By developing, a resist pattern having a deep opening corresponding to the location of the top of the tungsten plug is obtained. Next, a window is opened by RIE (reactive ion etching) so as to expose the top of the tungsten plug in the Low-k interlayer insulating film using the photoresist pattern as a mask. Then TaN (tantalum nitride) film or ZrN(zirconium nitride) film is deposited on the inner wall surface of the window. Next, Cu (copper) film is thinly formed, and making the thin Cu (copper) film as a seed, and Cu (copper) is plated until the window is completely buried. The Cu (copper) film and the Low-k interlayer insulating film are etched back by the CMP (chemical mechanical polishing) method to planarize the surface. In addition, SiN (silicon nitride) film of the present invention is evenly formed by CVD on the planarized surface over the structure resulting from the above-mentioned process. This recipe and condition are the same as previously described. Then an upper interlayer insulating layer and the upper layer wiring layer are formed respectively in a similar way to complete; a multi layer wiring structure.

As described above, the present invention solves the problem caused by the diffusion of Cu(Copper) in the wiring layer into the insulating film, and it also prevents the semiconductor device from decreasing operation speed by suppressing the increase in the capacitance between the wiring layers.

This invention is not limited to the interlayer insulating film of LSI, but it is applicable to the sidewall insulation film and the interlayer insulation film of TFT (Thin Film Transistor). Moreover, the present invention is not limited to the above embodiment and can be modified in various ways.

I claim:

1. A silicon nitride film comprising a ratio of N: Si of from 1.0–1.1:1 and a ratio of O: Si of from 0.1–0.15:1, and being formed through a catalytic CVD method by using monosilane and ammonia, and thereby having a relative dielectric constant of 6 or less.

2. The silicon nitride film as claimed in claim 1, wherein said catalytic CVD method is carried out with at least one catalyst selected from the group consisting of tungsten, platinum, palladium, molybdenum, silicon, alumina, silicon carbide, a metallic-deposited ceramics, tantalum, titanium, titanium oxide, and vanadium.

3. The silicon nitride film as claimed in claim 1, wherein said catalytic CVD method is carried out by applying a heating resistance to a catalyst.

4. The silicon nitride film as claimed in claim 2, wherein said catalytic CVD method is carried out by applying a heating resistance to said catalyst.

5. A semiconductor device comprising an insulating layer of said silicon nitride film as claimed in any one of claims 1 through 4.

6. A semiconductor device comprising an interlayer insulating layer of said silicon nitride film as claimed in any one of claims 1 through 4, in a multilayer structure.

7. A semiconductor device comprising an interlayer insulating layer of said silicon nitride film as claimed in any one of claims 1 through 4, between copper-including layers.

8. A semiconductor device comprising:
   a silicon nitride film as claimed in any one of claims 1 through 4 so as to entirely cover a lower wiring layer;
   a planarized insulating layer comprising one material selected from the group consisting of silicon oxide, silicon oxynitride, FSG (fluorosilicate glass), BPSG (borophosphosilicate, glass), PSG (phosphosilicate glass), and USG (undoped silicate glass) so as to cover said silicon nitride film.

9. A method for fabricating a semiconductor device, comprising the steps of:
   forming an interlayer insulating layer of silicon nitride film as claimed in any one of claims 1 through 4;
   depositing a film comprising at least one material selected from the group consisting of silicon oxide, silicon oxynitride, FSG (fluorosilicate glass), BPSG (borophosphosilicate glass), PSG (phosphosilicate glass), and USG (undoped silicate glass);
   forming a planarized insulating film by polishing the surface of said film.

10. The method for fabricating a semiconductor device as claimed in claim 9, wherein said interlayer insulating film formation step is performed by controlling a substrate holder temperature to over 150° C.

* * * * *